(12) United States Patent
Kim

(10) Patent No.: US 8,830,778 B2
(45) Date of Patent: Sep. 9, 2014

(54) REFRESH METHOD AND SEMICONDUCTOR MEMORY DEVICE USING THE SAME

(75) Inventor: Keun Kook Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 78 days.

(21) Appl. No.: 13/613,430

(22) Filed: Sep. 13, 2012

(65) Prior Publication Data

US 2013/0308394 A1 Nov. 21, 2013

(30) Foreign Application Priority Data

May 21, 2012 (KR) .................. 10-2012-0053907

(51) Int. Cl.
*G11C 7/00* (2006.01)
(52) U.S. Cl.
USPC .................... 365/222; 365/230.03
(58) Field of Classification Search
CPC ................................. G11C 11/40618
USPC .......................... 365/222, 230.03
See application file for complete search history.

(56) References Cited

U.S. PATENT DOCUMENTS

| | | | |
|---|---|---|---|
| 7,710,812 B2 * | 5/2010 | Fukuda | 365/222 |
| 2006/0146626 A1 * | 7/2006 | Lee | 365/222 |
| 2010/0182863 A1 * | 7/2010 | Fukiage | 365/222 |
| 2011/0161579 A1 | 6/2011 | Walker | |

FOREIGN PATENT DOCUMENTS

| | | |
|---|---|---|
| KR | 10-2009-0126976 A | 12/2009 |
| KR | 10-2012-0048841 | 5/2012 |

* cited by examiner

*Primary Examiner* — Anthan Tran
(74) *Attorney, Agent, or Firm* — William Park & Associates Patent Ltd.

(57) ABSTRACT

A semiconductor memory device includes an all bank select signal generation block configured to receive level signals including information on at least one bank which has been refreshed, and generate all bank select signals, in response to an all bank refresh command; and a bank block including a plurality of banks which are configured to be refreshed in response to the all bank select signals or are refreshed in response to per bank select signals which are enabled when the level signals are enabled.

23 Claims, 4 Drawing Sheets

REFRESH METHOD AND SEMICONDUCTOR MEMORY DEVICE USING THE SAME

CROSS-REFERENCE TO RELATED APPLICATION

The present application claims priority under 35 U.S.C 119(a) to Korean Patent Application No. 10-2012-0053907 filed on May 21, 2012 in the Korean Intellectual Property Office, which is incorporated herein by reference in its entirety set forth in full.

BACKGROUND

1. Field of Invention

Various embodiments of the present invention generally relate to a semiconductor memory device having a bank, and more particularly, to refreshing the bank of the semiconductor memory device and method of performing the same.

2. Description of Related Art

In general, in a semiconductor memory device, data signals are read as '1' or '0' according to amounts of charges accumulated in a plurality of memory cells in which the data signals are recorded. In this regard, since the charges accumulated in the memory cells are discharged as time goes by, it is difficult to determine a '1' or '0'. Thus, an auto refresh operation for amplifying the data signals recorded in the memory cells and re-recording the data signals in the memory cells is performed.

Auto refresh is divided into per bank refresh in which refresh is performed for respective banks of a semiconductor memory device and all bank refresh in which refresh is performed for all banks of the semiconductor memory device.

FIG. 1 is a block diagram a conventional semiconductor memory device in which auto refresh is performed.

Referring to FIG. 1, a semiconductor memory device includes a per bank refresh block 10 which receives a per bank refresh command PBR_CMD and generates per bank select signals PER_BS<1:4> enabled, an all bank refresh block 20 which receives an all bank refresh command ABR_CMD and generates an all bank select signal ALL_BS enabled, and a bank block 30 in which first to fourth banks 31 to 34, respectively, are respectively refreshed in the case where the per bank select signals PER_BS<1:4> are enabled and all of the first to fourth banks 31 to 34, respectively, are refreshed in the case where the all bank select signal ALL_BS is enabled.

Operations of the semiconductor memory device configured as mentioned above will be described with reference to FIG. 1, assuming that, after the first and second banks 31 and 32, respectively, are refreshed by receiving the per bank refresh command PBR_CMD, the all bank refresh command ABR_CMD is inputted.

First, the per bank refresh block 10 receives the per bank refresh command PBR_CMD, and enables the first and second per bank select signals PER_BS<1:2> and disables the third and fourth per bank select signals PER_BS<3:4>. The first and second banks 31 and 32, respectively, receive the enabled first and second per bank select signals PER_BS<1:2> and are refreshed. The third and fourth banks 33 and 34, respectively, receive the disabled third and fourth per bank select signals PER_BS<3:4> and are not refreshed.

Then, the all bank refresh block 20 receives the all bank refresh command ABR_CMD and enables the all bank select signal ALL_BS. The first to fourth banks 31 to 34 receive the enabled all bank select signal ALL_BS and are all refreshed.

In the semiconductor memory device configured in this way, in the case where the all bank refresh command ABR_CMD is inputted after the per bank refresh command PBR_CMD is inputted and the first and second banks 31 and 32, respectively, are refreshed, all of the first to fourth banks 31 to 34, respectively, are refreshed. Thus, since the first and second banks 31 and 32, respectively, are refreshed again, unnecessary current consumption is caused.

SUMMARY

An embodiment of the present invention generally relates to a semiconductor memory device in which a bank having undergone refresh is prevented from being repeatedly refreshed to reduce unnecessary current consumption.

In an embodiment, a semiconductor memory device includes: an all bank select signal generation block configured to receive level signals including information on at least one bank which has been refreshed, and generate all bank select signals, in response to an all bank refresh command; and a bank block including a plurality of banks which are configured to be refreshed in response to the all bank select signals or are refreshed in response to per bank select signals which are enabled when the level signals are enabled.

In an embodiment, a semiconductor memory device includes: a bank selection unit configured to store level signals including information on at least one bank which has been refreshed in response to a first pulse signal enabled when a per bank refresh command is inputted, and generate per bank select signals which are enabled when the level signals are enabled; a signal transfer unit configured to transfer the level signals in response to a second pulse signal enabled when an all bank refresh command is inputted, and generate all bank select signals; and a bank block including a plurality of banks which are configured to be refreshed in response to the per bank select signals or the all bank select signals.

In an embodiment, a refresh method includes: a first action of storing first and second level signals which are enabled in response to a per bank refresh command, and selecting banks to refresh, according to first and second per bank select signals which are enabled when the first and second level signals are enabled; and a second action of selecting banks to refresh, according to first and second all bank select signals which are generated by transferring the first and second level signals in response to an all bank refresh command.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Hereinafter, embodiments of the present invention will be described with reference to accompanying drawings. However, the embodiments are for illustrative purposes only and are not intended to limit the scope of the invention.

Figure 1:
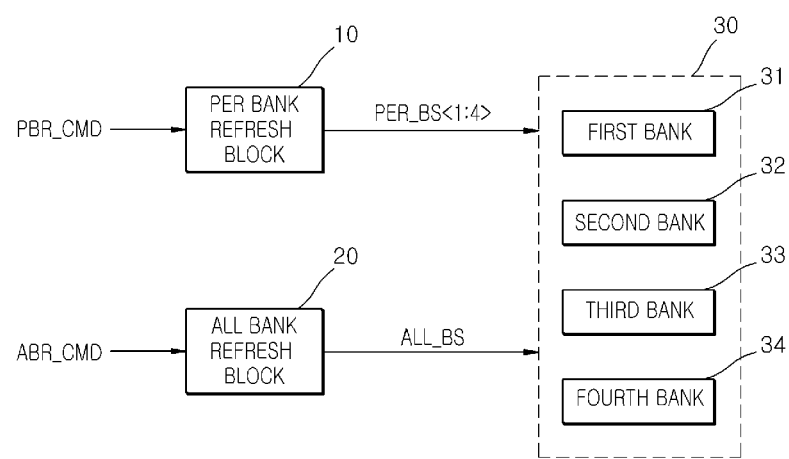
FIG. 1 is a block diagram showing a conventional semiconductor memory device in which auto refresh is performed.
Figure 2:
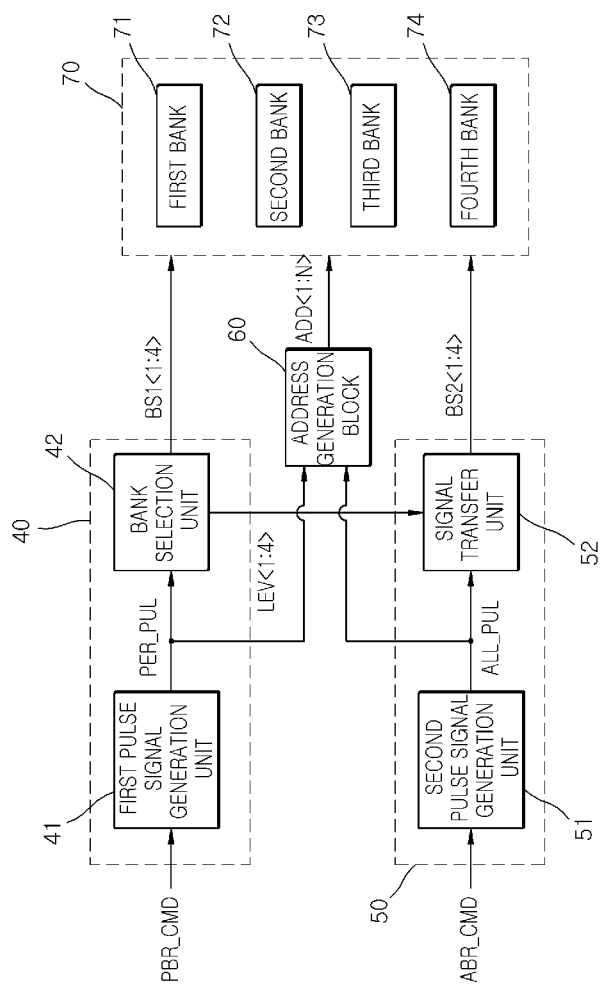
FIG. 2 is a block diagram showing the configuration of a semiconductor memory device in accordance with an embodiment.

FIG. 2 is a block diagram showing the configuration of a semiconductor memory device in accordance with an embodiment.

Referring to FIG. 2, a semiconductor memory device in accordance with an embodiment may include a per bank select signal generation block 40, an all bank select signal generation block 50, an address generation block 60, and a bank block 70.

The per bank select signal generation block 40 may include a first pulse signal generation unit 41 configured to receive a per bank refresh command PBR_CMD and generate a first pulse signal PER_PUL which is enabled, and a bank selection unit 42 configured to receive the first pulse signal PER_PUL and generate first to fourth level signals LEV<1:4> which are enabled, and generate first to fourth per bank select signals BS1<1:4> which are enabled, when the first to fourth level signals LEV<1:4> are enabled.

Additionally, the configuration of the bank selection unit 42 will be described below with reference to FIG. 3.

Figure 3:
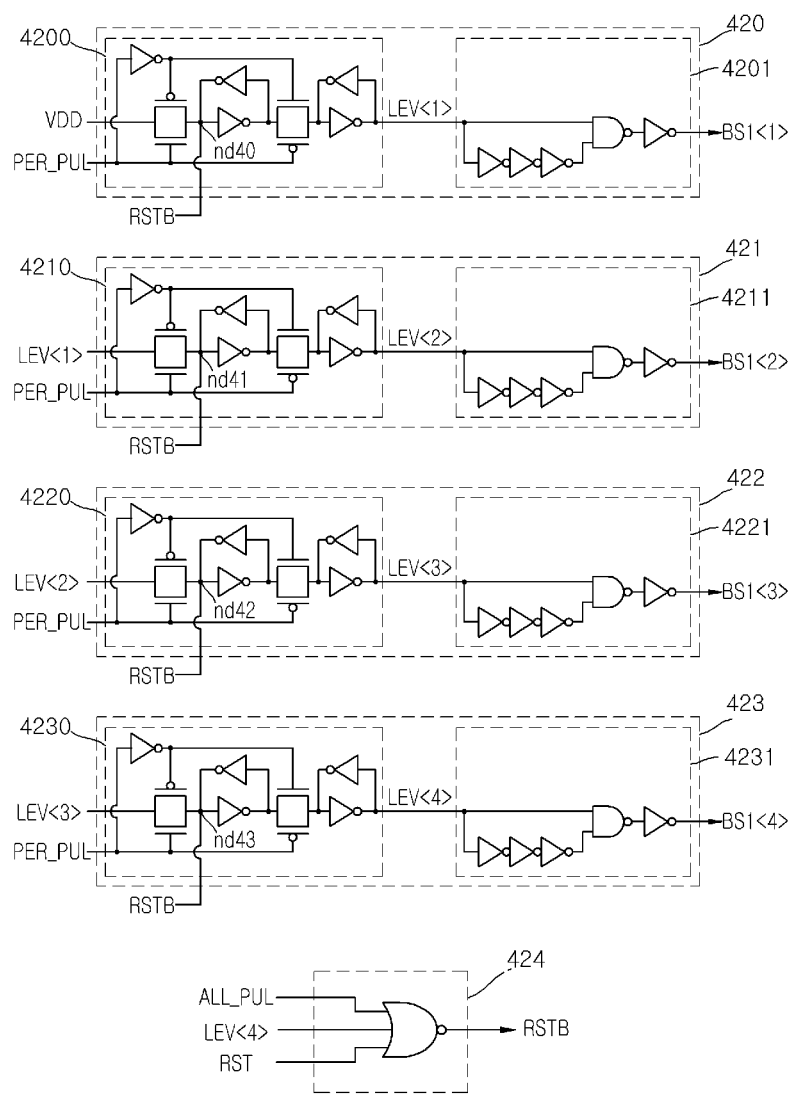
FIG. 3 is a circuit diagram of the bank selection unit included in the per bank select signal generation block shown in FIG. 2.

Referring to FIG. 3, the bank selection unit 42 may include a first bank selecting section 420 configured to receive the first pulse signal PER_PUL, buffer a power supply voltage VDD and generate the first level signal LEV<1> and the first per bank select signal BS1<1>. The bank selection unit 42 may include a second bank selecting section 421 configured to receive the first pulse signal PER_PUL, buffer the first level signal LEV<1> and generate the second level signal LEV<2> and the second per bank select signal BS1<2>. The bank selection unit 42 may include a third bank selecting section 422 configured to receive the first pulse signal PER_PUL, buffer the second level signal LEV<2> and generate the third level signal LEV<3> and the third per bank select signal BS1<3>. The bank selection unit 42 may include a fourth bank selecting section 423 configured to receive the first pulse signal PER_PUL, buffer the third level signal LEV<3> and generate the fourth level signal LEV<4> and the fourth per bank select signal BS1<4>.

The first bank selecting section 420 may include a first latch part 4200 configured to latch the power supply voltage VDD transferred to a first node nd40 when the first pulse of the first pulse signal PER_PUL is inputted, buffer the power supply voltage VDD and generate the first level signal LEV<1> enabled from a logic low level to a logic high level. The first bank selecting section 420 may include a first logic part 4201 configured to generate the first per bank select signal BS1<1> which may be enabled when the first level signal LEV<1> is enabled from the logic low level to the logic high level.

The second bank selecting section 421 may include a second latch part 4210 configured to latch the first level signal LEV<1> transferred to a second node nd41 when the second pulse of the first pulse signal PER_PUL is inputted, buffer the first level signal LEV<1> and generate the second level signal LEV<2> enabled from a logic low level to a logic high level. The second bank selecting section 421 may include a second logic part 4211 configured to generate the second per bank select signal BS1<2> which may be enabled when the second level signal LEV<2> is enabled from the logic low level to the logic high level.

The third bank selecting section 422 may include a third latch part 4220 configured to latch the second level signal LEV<2> transferred to a third node nd42 when the third pulse of the first pulse signal PER_PUL is inputted, buffer the second level signal LEV<2> and generate the third level signal LEV<3> enabled from a logic low level to a logic high level. The third bank selecting section 422 may include a third logic part 4221 configured to generate the third per bank select signal BS1<3> which may be enabled when the third level signal LEV<3> is enabled from the logic low level to the logic high level.

The fourth bank selecting section 423 may include a fourth latch part 4230 configured to latch the third level signal LEV<3> transferred to a fourth node nd43 when the fourth pulse of the first pulse signal PER_PUL is inputted, buffer the third level signal LEV<3> and generate the fourth level signal LEV<4> enabled from a logic low level to a logic high level. The fourth bank selecting section 423 may include a fourth logic part 4231 configured to generate the fourth per bank select signal BS1<4> which may be enabled when the fourth level signal LEV<4> is enabled from the logic low level to the logic high level.

The bank selection unit 42 further may include an initializing signal generating section 424 configured to NOR a reset signal RST, the fourth level signal LEV<4> and a second pulse signal ALL_PUL and generate an initializing signal RSTB for initializing the first to fourth nodes nd40 to nd43 to logic low levels. The reset signal RST is a signal which may be enabled during a power-up period in which the level of an internal voltage of the semiconductor memory device rises according to the level of the power supply voltage VDD. That is to say, the bank selection unit 42 may initialize the first to fourth nodes nd40 to nd43 to the logic low levels and disable the first to fourth level signals LEV<1:4>, during the power-up period and in the case where the fourth level signal LEV<4> is enabled and the second pulse signal ALL_PUL is enabled.

Referring to FIG. 2, the all bank select signal generation block 50 may include a second pulse signal generation unit 51 configured to receive an all bank refresh command ABR_CMD and generate the second pulse signal ALL_PUL which is enabled, and a signal transfer unit 52 configured to receive the second pulse signal ALL_PUL, inversion-buffer the first to fourth level signals LEV<1:4> and generate first to fourth all bank select signals BS2<1:4>.

Additionally, the configuration of the signal transfer unit 52 will be described below with reference to FIG. 4.

Figure 4:
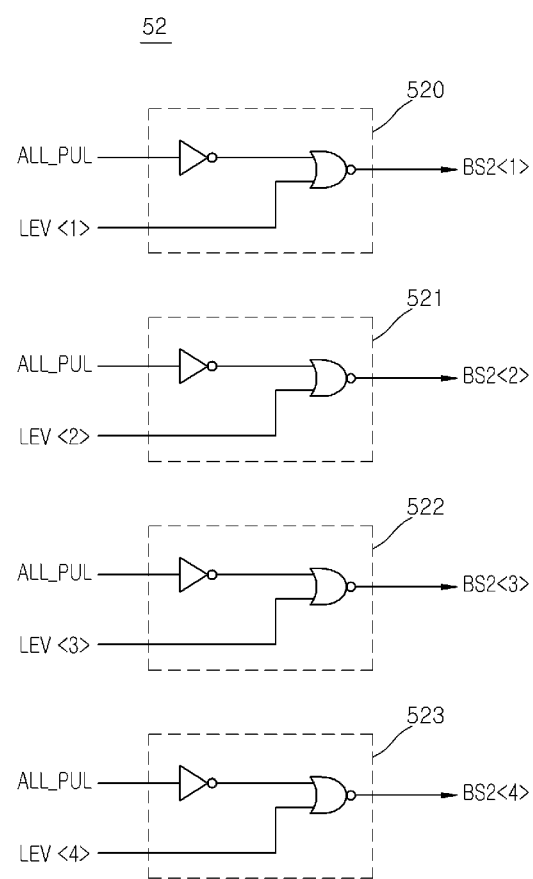
FIG. 4 is a circuit diagram of the signal transfer unit included in the all bank select signal generation block shown in FIG. 2.

Referring to FIG. 4, the signal transfer unit 52 may include a first buffer section 520 configured to receive the second pulse signal ALL_PUL, inversion-buffer the first level signal LEV<1> and generate the first all bank select signal BS2<1>. The signal transfer unit 52 may include a second buffer section 521 configured to receive the second pulse signal ALL_PUL, inversion-buffer the second level signal LEV<2> and generate the second all bank select signal BS2<2>. The signal transfer unit 52 may include a third buffer section 522 configured to receive the second pulse signal ALL_PUL, inversion-buffer the third level signal LEV<3> and generate the third all bank select signal BS2<3>. The signal transfer unit 52 may include a fourth buffer section 523 configured to receive the second pulse signal ALL_PUL, inversion-buffer the fourth level signal LEV<4> and generate the fourth all bank select signal BS2<4>.

The address generation block 60 may be configured to count and generate internal addresses ADD<1:N> in the case where the first pulse signal PER_PUL or the second pulse signal ALL_PUL is inputted.

The bank block 70 may include a first bank 71 configured to be refreshed according to a combination of the internal addresses ADD<1:N> when the first per bank select signal BS1<1> or the first all bank select signal BS2<1> is enabled. The bank block 70 may include a second bank 72 configured to be refreshed according to a combination of the internal addresses ADD<1:N> when the second per bank select signal BS1<2> or the second all bank select signal BS2<2> is enabled. The bank block 70 may include a third bank 73 configured to be refreshed according to a combination of the internal addresses ADD<1:N> when the third per bank select signal BS1<3> or the third all bank select signal BS2<3> is enabled. The bank block 70 may include a fourth bank 74 configured to be refreshed according to a combination of the internal addresses ADD<1:N> when the fourth per bank select signal BS1<4> or the fourth all bank select signal BS2<4> is enabled.

The refresh operation of the semiconductor memory device configured as mentioned above will be described with reference to FIGS. 2 to 4, this example is where the all bank refresh command ABR_CMD is inputted while the refresh operation is performed by receiving the per bank refresh command PBR_CMD, that is, where the all bank refresh command ABR_CMD is inputted after the first and second banks 71 and 72 are refreshed by the per bank refresh command PBR_CMD.

First, the first pulse signal generation unit 41 of the per bank select signal generation block 40 receives the per bank refresh command PBR_CMD firstly inputted and generates the first pulse signal PER_PUL to a logic high level.

The first bank selecting section 420 of the bank selection unit 42 receives the first pulse signal PER_PUL of the logic high level, buffers the power supply voltage VDD and generates the first level signal LEV<1> which is enabled from the logic low level to the logic high level, and generates the first per bank select signal BS1<1> to a logic high level. The second to fourth bank selecting sections 421 to 423 generate the second to fourth level signals LEV<2:4> of the logic low levels and the second to fourth per bank select signals BS1<2:4> of logic low levels.

The address generation block 60 receives the first pulse signal PER_PUL of the logic high level and counts the internal addresses ADD<1:N>.

The first bank 71 of the bank block 70 receives the first per bank select signal BS1<1> of the logic high level and is refreshed according to the combination of the internal addresses ADD<1:N>. The second to fourth banks 72 to 74 receive the second to fourth per bank select signals BS1<2:4> of the logic low levels and are not refreshed.

Next, the first pulse signal generation unit 41 of the per bank select signal generation block 40 receives the per bank refresh command PBR_CMD secondly inputted and generates the first pulse signal PER_PUL to the logic high level.

The first bank selecting section 420 of the bank selection unit 42 receives the first pulse signal PER_PUL of the logic high level, and generates the first level signal LEV<1> of the logic high level and the first per bank select signal BS1<1> of a logic low level. The second bank selecting section 421 of the bank selection unit 42 receives the first pulse signal PER_PUL of the logic high level, buffers the first level signal LEV<1> of the logic high level and generates the second level signal LEV<2> which transitions from the logic low level to the logic high level, and generates the second per bank select signal BS1<2> to a logic high level. The third and fourth bank selecting sections 422 and 423 generate the third and fourth level signals LEV<3:4> of the logic low levels and the third and fourth per bank select signals BS1<3:4> of the logic low levels.

The address generation block 60 receives the first pulse signal PER_PUL of the logic high level and counts the internal addresses ADD<1:N>.

The first bank 71 of the bank block 70 receives the first per bank select signal BS1<1> of the logic low level and is not refreshed. The second bank 72 of the bank block 70 receives the second per bank select signal BS1<2> of the logic high level and is refreshed according to the combination of the internal addresses ADD<1:N>. The third and fourth banks 73 and 74 receive the third and fourth per bank select signals BS1<3:4> of the logic low levels and are not refreshed.

Then, the second pulse signal generation unit 51 of the all bank select signal generation block 50 receives the all bank refresh command ABR_CMD and generates the second pulse signal ALL_PUL to a logic high level.

The first buffer section 520 of the signal transfer unit 52 receives the second pulse signal ALL_PUL of the logic high level, inversion-buffers the first level signal LEV<1> of the logic high level and generates the first all bank select signal BS2<1> of a logic low level. The second buffer section 521 of the signal transfer unit 52 receives the second pulse signal ALL_PUL of the logic high level, inversion-buffers the second level signal LEV<2> of the logic high level and generates the second all bank select signal BS2<2> of a logic low level. The third buffer section 522 of the signal transfer unit 52 receives the second pulse signal ALL_PUL of the logic high level, inversion-buffers the third level signal LEV<3> of the logic low level and generates the third all bank select signal BS2<3> of a logic high level. The fourth buffer section 523 of the signal transfer unit 52 receives the second pulse signal ALL_PUL of the logic high level, inversion-buffers the fourth level signal LEV<4> of the logic low level and generates the fourth all bank select signal BS2<4> of a logic high level.

The address generation block 60 receives the second pulse signal ALL_PUL of the logic high level and counts the internal addresses ADD<1:N>.

The first bank 71 of the bank block 70 receives the first all bank select signal BS2<1> of the logic low level and is not refreshed. The second bank 72 of the bank block 70 receives the second all bank select signal BS2<2> of the logic low level and is not refreshed. The third bank 73 of the bank block 70 receives the third all bank select signal BS2<3> of the logic high level and is refreshed according to the combination of the internal addresses ADD<1:N>. The fourth bank 74 of the bank block 70 receives the fourth all bank select signal BS2<4> of the logic high level and is refreshed according to the combination of the internal addresses ADD<1:N>.

As is apparent from the above descriptions, in the semiconductor memory device in accordance with an embodiment, information on banks which have been refreshed in a per bank refresh operation is stored, and the banks which have been refreshed in the per bank refresh operation are not refreshed in an all bank refresh operation, whereby it is possible to reduce unnecessary current consumption.

The embodiments have been disclosed above for illustrative purposes. Those skilled in the art will appreciate that various modifications, additions, and substitutions are possible, without departing from the scope and spirit of the invention as disclosed in the accompanying claims.

What is claimed is:

1. A semiconductor memory device comprising:
   an all bank select signal generation block configured to receive level signals including information on at least one bank which has been refreshed, and generate all bank select signals, in response to an all bank refresh command; and
   a bank block including a plurality of banks which are configured to be refreshed in response to the all bank select signals or are refreshed in response to per bank select signals which are enabled when the level signals are enabled, wherein the all bank select signals are enabled when the per bank select signals are disabled, and the all bank select signals are signals to select the plurality of banks which has not been refreshed by the per bank select signals.

2. The semiconductor memory device according to claim 1, wherein the all bank select signals are signals which are disabled when the level signals are enabled.

3. The semiconductor memory device according to claim 1, wherein the all bank select signal generation block comprises:
   a first pulse signal generation unit configured to generate a first pulse signal which is enabled in response to the all bank refresh command; and
   a signal transfer unit configured to buffer the level signals in response to the first pulse signal and generate the all bank select signals.

4. The semiconductor memory device according to claim 3, wherein the signal transfer unit comprises:
   a first buffer section configured to inversion-buffer a first level signal in response to the first pulse signal and generate a first all bank select signal; and
   a second buffer section configured to inversion-buffer a second level signal in response to the first pulse signal and generate a second all bank select signal.

5. The semiconductor memory device according to claim 4, further comprising:
   a per bank select signal generation block configured to generate the level signals and the per bank select signals in response to a per bank refresh command.

6. The semiconductor memory device according to claim 5, wherein the per bank select signal generation block comprises:
   a second pulse signal generation unit configured to generate a second pulse signal which is enabled in response to the per bank refresh command; and
   a bank selection unit configured to store the level signals which are enabled in response to the second pulse signal and generate the per bank select signals which are enabled in response to the level signals.

7. The semiconductor memory device according to claim 6, wherein the bank selection unit comprises:
   a first bank selecting section configured to buffer a power supply voltage which is transferred to a first node, in response to the second pulse signal, and generate the first level signal and a first per bank select signal;
   a second bank selecting section configured to buffer the first level signal which is transferred to a second node, in response to the second pulse signal, and generate the second level signal and a second per bank select signal; and
   an initializing signal generating section configured to generate an initializing signal for initializing the first and second nodes when at least any one of a reset signal enabled during a power-up period in which a level of an internal voltage rises according to a level of the power supply voltage, the second level signal, and the second pulse signal is enabled.

8. The semiconductor memory device according to claim 7, wherein the first bank selecting section comprises:
   a first latch part configured to buffer the power supply voltage in response to the second pulse signal, and store the first level signal which is enabled; and
   a first logic part configured to generate the first per bank select signal which is enabled when the first level signal is enabled.

9. The semiconductor memory device according to claim 7, wherein the second bank selecting section comprises:
   a second latch part configured to buffer the first level signal in response to the second pulse signal, and store the second level signal which is enabled; and
   a second logic part configured to generate the second per bank select signal which is enabled when the second level signal is enabled.

10. The semiconductor memory device according to claim 7, further comprising:
    an address generation block configured to generate internal addresses when the first pulse signal or the second pulse signal is inputted.

11. The semiconductor memory device according to claim 10, wherein the bank block comprises:
    a first bank configured to be refreshed according to a combination of the internal addresses in response to the first per bank select signal or the first all bank select signal; and
    a second bank configured to be refreshed according to a combination of the internal addresses in response to the second per bank select signal or the second all bank select signal.

12. A semiconductor memory device comprising:
    a bank selection unit configured to store level signals including information on at least one bank which has been refreshed in response to a first pulse signal enabled when a per bank refresh command is inputted, and generate per bank select signals which are enabled when the level signals are enabled;
    a signal transfer unit configured to transfer the level signals in response to a second pulse signal enabled when an all bank refresh command is inputted, and generate all bank select signals; and
    a bank block including a plurality of banks which are configured to be refreshed in response to the per bank select signals or the all bank select signals,
    wherein the all bank select signals are enabled when the per bank select signals are disabled, and the all bank select signals are signals to select the plurality of banks which has not been refreshed by the per bank select signals.

13. The semiconductor memory device according to claim 12, wherein the all bank select signals are signals which are disabled when the level signals are enabled.

14. The semiconductor memory device according to claim 12, wherein the bank selection unit comprises:
    a first bank selecting section configured to buffer a power supply voltage which is transferred to a first node, in response to the first pulse signal, and generate a first level signal and a first per bank select signal;
    a second bank selecting section configured to buffer the first level signal which is transferred to a second node, in response to the first pulse signal, and generate a second level signal and a second per bank select signal; and
    an initializing signal generating section configured to generate an initializing signal for initializing the first and second nodes when at least any one of a reset signal enabled during a power-up period in which a level of an internal voltage rises according to a level of the power supply voltage , the second level signal and the second pulse signal is enabled.

15. The semiconductor memory device according to claim 14, wherein the first bank selecting section comprises:
    a first latch part configured to buffer the power supply voltage in response to the first pulse signal, and store the first level signal which is enabled; and a first logic part configured to generate the first per bank select signal which is enabled when the first level signal is enabled.

16. The semiconductor memory device according to claim 14, wherein the second bank selecting section comprises:
    a second latch part configured to buffer the first level signal in response to the first pulse signal, and store the second level signal which is enabled; and
    a second logic part configured to generate the second per bank select signal which is enabled when the second level signal is enabled.

17. The semiconductor memory device according to claim 14, wherein the signal transfer unit comprises:
    a first buffer section configured to inversion-buffer the first level signal in response to the second pulse signal and generate a first all bank select signal; and
    a second buffer section configured to inversion-buffer the second level signal in response to the second pulse signal and generate a second all bank select signal.

18. The semiconductor memory device according to claim 17, further comprising:
    an address generation block configured to generate internal addresses when the first pulse signal or the second pulse signal is inputted.

19. The semiconductor memory device according to claim 18, wherein the bank block comprises:
    a first bank configured to be refreshed according to a combination of the internal addresses in response to the first per bank select signal or the first all bank select signal; and
    a second bank configured to be refreshed according to a combination of the internal addresses in response to the second per bank select signal or the second all bank select signal.

20. A refresh method comprising:
    a first action of storing first and second level signals which are enabled in response to a per bank refresh command, and selecting banks to refresh, according to first and second per bank select signals which are enabled when the first and second level signals are enabled; and
    a second action of selecting banks to refresh, according to first and second all bank select signals which are generated by transferring the first and second level signals in response to an all bank refresh command,
    wherein the all bank select signals are enabled when the per bank select signals are disabled, and the all bank select signals are signals to select the plurality of banks which has not been refreshed by the per bank select signals.

21. The refresh method according to claim 20, wherein the first all bank select signal is a signal which is disabled when the first level signal is enabled, and the second all bank select signal is a signal which is disabled when the second level signal is enabled.

22. The refresh method according to claim 20, wherein the first action comprises:
    generating a first pulse signal which is enabled in response to the per bank refresh command;
    generating the first and second level signals in response to the first pulse signal; and
    generating the first and second per bank select signals which are enabled in response to the first and second level signals.

23. The refresh method according to claim 20, wherein the second action comprises:
    generating a second pulse signal which is enabled in response to the all bank refresh command; and
    inversion-buffering the first and second level signals in response to the second pulse signal, and generating the first and second all bank select signals.

* * * * *